(12) United States Patent
Ramaswami et al.

(10) Patent No.: US 7,609,190 B1
(45) Date of Patent: Oct. 27, 2009

(54) DEVICE AND METHOD FOR TESTING OF DIGITAL-TO-ANALOG CONVERTER

(75) Inventors: Ravi Ramaswami, Cuptertino, CA (US); Michael A. Bourland, Austin, TX (US); Feng Zhao, Markham (CA)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/107,502

(22) Filed: Apr. 22, 2008

(51) Int. Cl.
*H03M 1/66* (2006.01)

(52) U.S. Cl. .................. 341/144; 341/120; 341/136

(58) Field of Classification Search .................. 341/120, 341/144

See application file for complete search history.

(56) References Cited

U.S. PATENT DOCUMENTS 6,992,609 B1 * 1/2006 Zelenin et al. .............. 341/144
7,355,537 B2 * 4/2008 Lin ............................ 341/120

* cited by examiner

*Primary Examiner*—Khai M Nguyen

(57) ABSTRACT

A current-steering digital-to-analog converter (DAC) is tested using a test component having a relaxation oscillator with an oscillation frequency based on the output current of the DAC. A series of test values is provided in sequence to the DAC for conversion to an output current with a magnitude that varies with the test values. The test component counts the number of oscillations ("the oscillation count") of the relaxation oscillator over a fixed duration that is substantially equal for each test value. As the number of oscillations over the fixed duration depends on the oscillation frequency of the relaxation oscillator, which in turn is based on the magnitude of the output current, the oscillation count can be used as a relative measure of the magnitude of the output current for the corresponding test value. Accordingly, the oscillation counts for the test values can be used to determine operational characteristics of the DAC.

20 Claims, 4 Drawing Sheets

DEVICE AND METHOD FOR TESTING OF DIGITAL-TO-ANALOG CONVERTER

FIELD OF THE DISCLOSURE

The present disclosure relates generally to digital-to-analog converters (DACs) and more particularly to testing DACs.

BACKGROUND

High-speed current-steering digital-to-analog converters (DACs) often are used in display drivers and other systems to convert a digital code to a corresponding analog output current used to drive a display device or other component. Because fault models for analog simulation often are not fully defined, the DACs generally are specification tested after manufacturing by verifying that the input to, and the output from, the DAC meets specifications. Typically, this testing is achieved via automatic test equipment (ATE) that ramps through all possible DAC codes within the operating range of the DAC and then measuring the output current of the DAC resulting from each DAC code. However, it often is not economically feasible to obtain automatic testing equipment that is capable of testing a high-performance DAC at its full operating frequency and resolution. Thus, automatic test equipment that operates a substantially lower frequency typically is used to test high-performance DACs, a procedure which often fails to correctly assess the operational characteristics of a DAC due to the difference between the operating frequency and the test frequency. Accordingly, an improved technique for testing DACs at their operating frequencies would be advantageous.

BRIEF DESCRIPTION OF THE DRAWINGS

The present disclosure may be better understood and its numerous features and advantages made apparent to those skilled in the art by referencing the accompanying drawings. The use of the same reference symbols in different drawings indicates similar or identical items.

DETAILED DESCRIPTION

FIGS. 1-8 illustrate example techniques for testing a current-steering digital-to-analog converter (DAC) using a test component. In one embodiment, the test component includes a relaxation oscillator having an oscillation frequency based on the output current of the DAC. A series of test values is provided in sequence to the DAC for conversion to an output current with a magnitude that varies with the test values. The test component counts the number of oscillations ("the oscillation count") of the relaxation oscillator over a fixed duration or period that is substantially equal for each test value. As the number of oscillations over the fixed duration depends on the oscillation frequency of the relaxation oscillator, which in turn is based on the magnitude of the output current, the oscillation count can be used as a relative measure of the magnitude of the output current for the corresponding test value. Accordingly, the oscillation counts for some or all of the test values are used to determine operational characteristics of the DAC, including, but not limited to, the integral non-linearity (INL) characteristics or the differential non-linearity (DNL) characteristics of the DAC. These operational characteristics then can be used to verify whether the DAC meets certain operational specifications, such as a specified maximum DNL or a specified maximum INL.

For ease of illustration, the example DAC test techniques are described herein in the context of a video system utilizing one or more DACs to convert digital video data into corresponding analog signals for driving a display device. However, these test techniques can be implemented in other systems utilizing current-steering DACs using the guidelines provided herein without departing from the scope of the present disclosure. Further, the example DAC test techniques are described herein in the context of built-in self-test (BIST) analysis of a current-steering DAC. However, the test components can be implemented, in whole or in part, external to the device in which the DAC is implemented without departing from the scope of the present disclosure.

Figure 1:
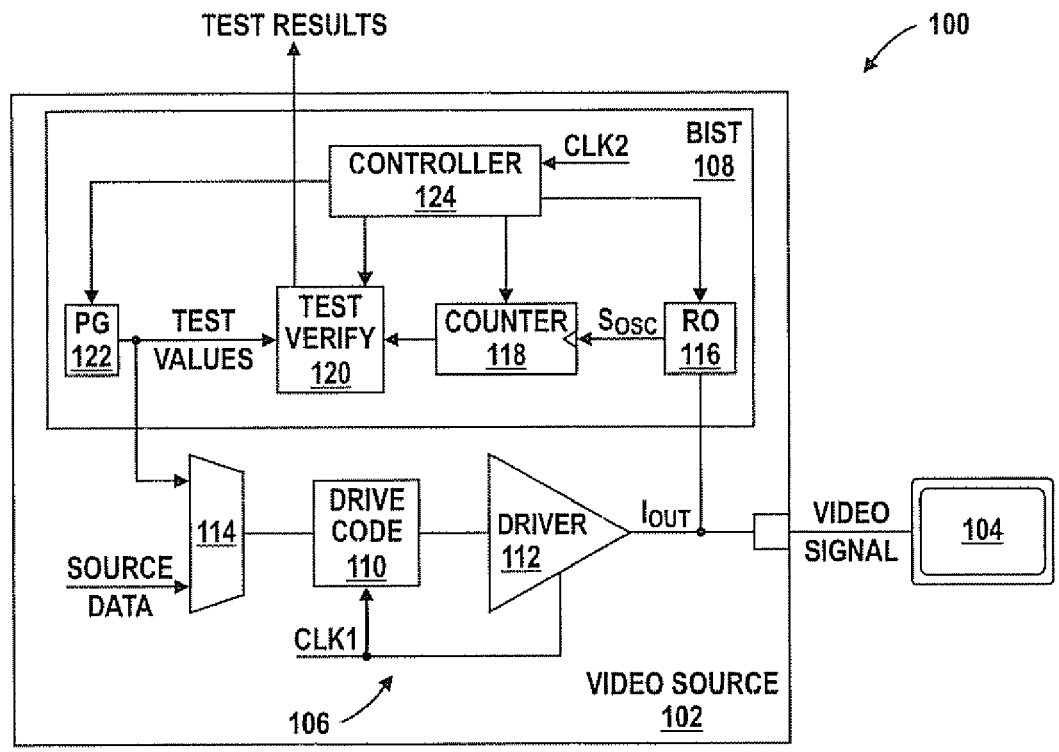
FIG. 1 is a diagram illustrating an example display system implementing a current-steering digital-to-analog converter (DAC) with a built-in self-test (BIST) component in accordance with at least one embodiment of the present disclosure.

FIG. 1 illustrates a video system 100 in accordance with at least one embodiment of the present disclosure. The video system 100 includes a video source 102 and a display device 104. The video system 100 can include any of a variety of video systems, including a home entertainment system, a computer system, a portable video device (e.g., a video-enabled cellular phone or a video-enabled portable music player), and the like. To illustrate, the video source 102 can include a digital versatile disc (DVD) player, a video controller of a personal computer or a video-enabled portable device, a personal video recorder (PVR), and the like. The display device 104 can include, for example, a television, a computer monitor, a display of a portable device, and the like.

The video source 102 includes a source of digital video data (identified as "source data" in FIG. 1), a current-steering digital-to-analog converter (DAC) 106, and a built-in self-test (BIST) component 108. The DAC 106 includes a drive code latch 110 and a current driver 112 operated based on a clock signal CLK1. The drive code latch 110 receives and latches a drive code value. The current driver 112 drives an output current $I_{out}$, where the magnitude of the output current $I_{out}$ is based on the drive code value. In one embodiment, the current driver 112 is implemented as a bank of parallel switch-controlled current sources, whereby one or more of the current sources is selectively enabled based on the drive code value stored in the drive code latch 110 to source current to the output of the current driver 112, where the output current $I_{out}$ of the current driver 112 is the sum of the currents sourced by the enabled current sources. The video source 102 further can include a multiplexer 114 or other selection logic connected at the input of the drive code latch 110 to select between source video data generated during normal operation of the video system 100 or test data (discussed below) during test operation.

The BIST component 108 includes a relaxation oscillator 116, a counter 118, a test verify module 120, a pattern generator 122, and a BIST controller 124 operated based on a second clock signal CLK2 (typically having a frequency greater than clock signal CLK1). The relaxation oscillator 116 includes an input coupled to the output of the current driver 112 to receive the current $I_{out}$ and an output to provide an oscillation signal $S_{osc}$ having a frequency $f_{osc}$ when in a test mode. In at least one embodiment, the relaxation oscillator 116 is configured such that the frequency $f_{osc}$ of the oscillation signal $S_{osc}$ is substantially proportional to the magnitude of the output current $I_{out}$. The relaxation oscillator 116 can include any of a variety of oscillation circuits based on the charge and discharge of one or more capacitors. Example implementations of the relaxation oscillator 116 are illustrated in greater detail below with reference to FIGS. 2, 3, and 4. However, other types of relaxation oscillators, such as an op-amp-based hysteresis oscillator, a unijunction transistor oscillator, charge-pump oscillator, or voltage-control-oscillator, can be implemented using the guidelines provided herein.

The counter 118 includes a count input coupled to the output of the relaxation oscillator 116 to receive the oscillation signal $S_{osc}$, an input to receive a clear signal, an input to receive an enable signal, and an output to provide a count value. In response to the enable signal being asserted by the BIST controller 124 (indicating the video source 102 is in a test mode), the counter 118 is configured to count the oscillations of the oscillation signal $S_{osc}$ (the output signal) of the relaxation oscillator 116 (e.g., by counting rising edges) until the clear signal is asserted, at which point the counter 118 outputs the count as the total oscillation count for the period, reinitializes its count value to a predetermined start value (e.g., zero), and begins counting oscillations of the oscillation signal $S_{osc}$.

The pattern generator 122 includes an output connected to the test verify module 120 and the drive code latch 110 (via the multiplexer 114). When in a test mode, the pattern generator 122 provides a predetermined sequence of test values. To illustrate, assuming the DAC 106 is a ten-bit DAC with a drive code range of 0x000 to 0x3FF, the series of test values could include 1024 ($2^{10}$) test values that initiate at 0x000 and monotonically increase to 0x3FF or that initiate at 0x3FF and monotonically decrease to 0x000. Each test value of the series is latched in turn as the drive code value of the drive code latch 110 for a fixed duration (based on, for example, the clock signal CLK1) and thus is used to control the current driver 112 to drive the output current $I_{out}$ at a magnitude corresponding to the test value for the fixed duration. In at least one embodiment, each test value is used for the same duration, where the duration is based on the frequency of the clock signal CLK1.

The series of test values provided by the pattern generator 112 can be programmed in any of a variety of ways. In one embodiment, the test values can be scanned into the pattern generator 112 via Joint Test Action Group (JTAG)-compliant interface or other scan test interface. Alternately, the pattern generator 112 can obtain the series of test values via a read-only memory (ROM), a read only memory (RAM), and the like.

The test verify module 120 is configured to receive the series of test values and the total oscillation counts for the series of test values from the counter 118 as each is generated, and based on these value determine one or more operational characteristics of the DAC 106. The results of this analysis of the count values are provided as test results that can be used by a test operator or an automated test equipment to determine whether the DAC 106 is operating consistent with identified specifications. The test results can be provided via a scan test interface (e.g., a JTAG interface), stored in a memory or other storage device, and the like. The test verify module 120 can be implemented as, for example, a hardware-based state machine.

The BIST controller 124 includes an input to receive the clock signal CLK2, an input to receive a test mode indicator (not shown) when the video source 102 is placed in a test mode, and outputs to provide control signals to the other components of the BIST component 108, such as the clear and enable signals provided to the counter 118. The BIST controller can be implemented as, for example, a hardware-based state machine.

During normal operation, the multiplexer 114 is configured to selected the source video data for input to the DAC 106, which in turn converts the values of the source video data into a corresponding magnitude of the output current $I_{out}$, which is used to drive the display device 104. During test operation, BIST controller 124 enables the pattern generator 122 to initiate sequential output of the series of test values and the multiplexer 114 is configured to select the test values for input to DAC 106, which in turn converts each test value into a corresponding magnitude of the output current $I_{out}$. In at least one embodiment, the DAC 106 is configured to utilize each test value to drive the output current $I_{out}$ for the same fixed duration. The relaxation oscillator 116 receives the output current $I_{out}$ and modifies the frequency $f_{osc}$ of its output signal based on the magnitude of the output current $I_{out}$. Thus, as the magnitude of the current $I_{out}$ changes for each new test value, so changes the frequency $f_{osc}$ of the relaxation oscillator 116. As each test value is supplied to the DAC 106, the counter 118 is cleared to its initial count value (e.g., zero) and then begins to count the oscillations of the oscillation signal $S_{osc}$ for the same fixed duration that the test value is used to control the DAC 106. The total oscillation count for the fixed duration is provided to the test verify module 120 and then the counter 118 is cleared to its initial count so as to begin counting oscillations of the oscillation signal $S_{osc}$ for the next test value of the series.

In at least one embodiment, the DAC 106 is intended to operate substantially linearly (i.e., an increase in the drive code value results in a substantially proportional increase in the magnitude of the output current $I_{out}$). If the DAC 106 has a substantially linear response (which typically is a desirable characteristic in a DAC), the change in magnitude of the output current of the DAC 106 from the use of a first test value to a second test value is substantially proportional to the magnitude of the difference between the first test value and the second test value. As noted above, the oscillation frequency $f_{osc}$ of the relaxation oscillator is based on the magnitude of the output current $I_{out}$ of the current driver 112, which in turn is based on the magnitude of the test value latched at the drive code latch 110. Because most relaxation oscillator implementations are linear across a wide range of input current, the change in the oscillation frequency $f_{osc}$ should be substantially constant for each increment of the test value used to control the DAC 106. Thus, because the counter 118 determines the total oscillation count over the same fixed duration for each test value, the change in the oscillation count value likewise is expected to be constant between each increment of the test value supplied to the DAC 106. By subtracting the relaxation count of the lesser test value from the relaxation count of the greater test value of two sequential test values, variations in the relaxation oscillator components from die to die can be removed as a potential source of error.

To illustrate, assuming the DAC 106 is a 10-bit DAC (and thus has a drive code range of 0 to 1023 ($2^{10}$−1)) and assuming the DAC 106 has a range of 0 mA to 20 mA, each increment in the test value used to control the DAC 106 would result in an increase of approximately 19.5 uA (20 mA/1023 steps) in the magnitude of the output current $I_{out}$ of the DAC 106 if the DAC 106 has a linear response. Thus, for a linear DAC 106, each increment of the test value would result in a constant increase in the oscillation frequency $f_{osc}$ of the relaxation oscillator 116, which in turn would result in a constant increase in the total oscillation count determined by the counter 118 for a fixed, constant duration that each test value is used to control the DAC 106.

As described in greater detail herein, the test verify module 120, in one embodiment, utilizes these expected relationships between the changes in the total oscillation count values and the changes in the test values to determine the linear characteristics of the DAC 106.

Figure 2:
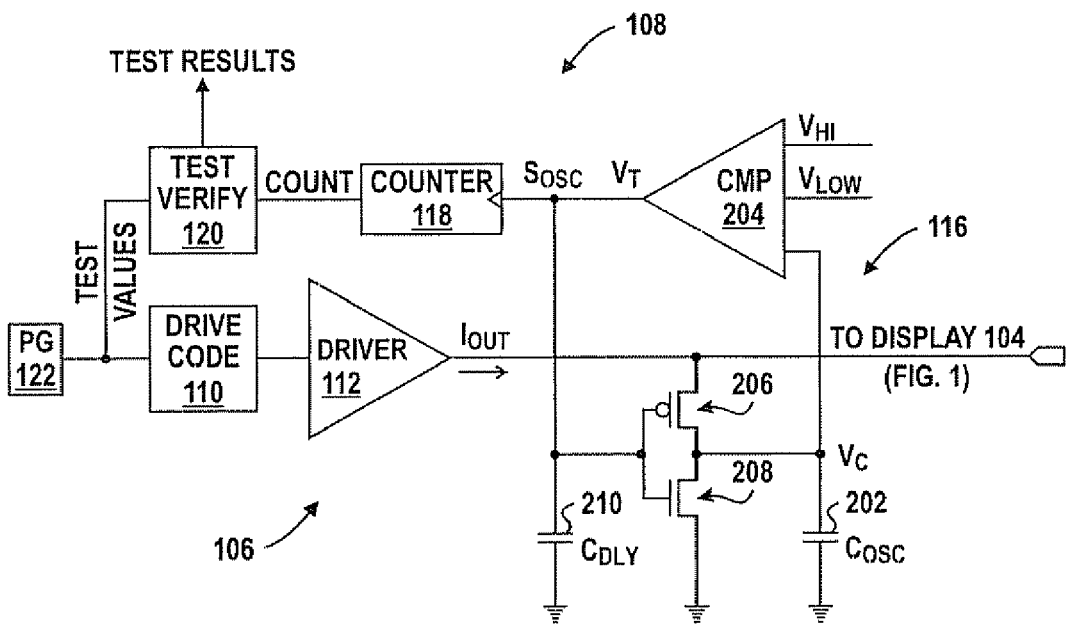
FIG. 2 is a diagram illustrating an example implementation of the DAC and the BIST component of FIG. 1 in accordance with at least one embodiment of the present disclosure.
Figure 3:
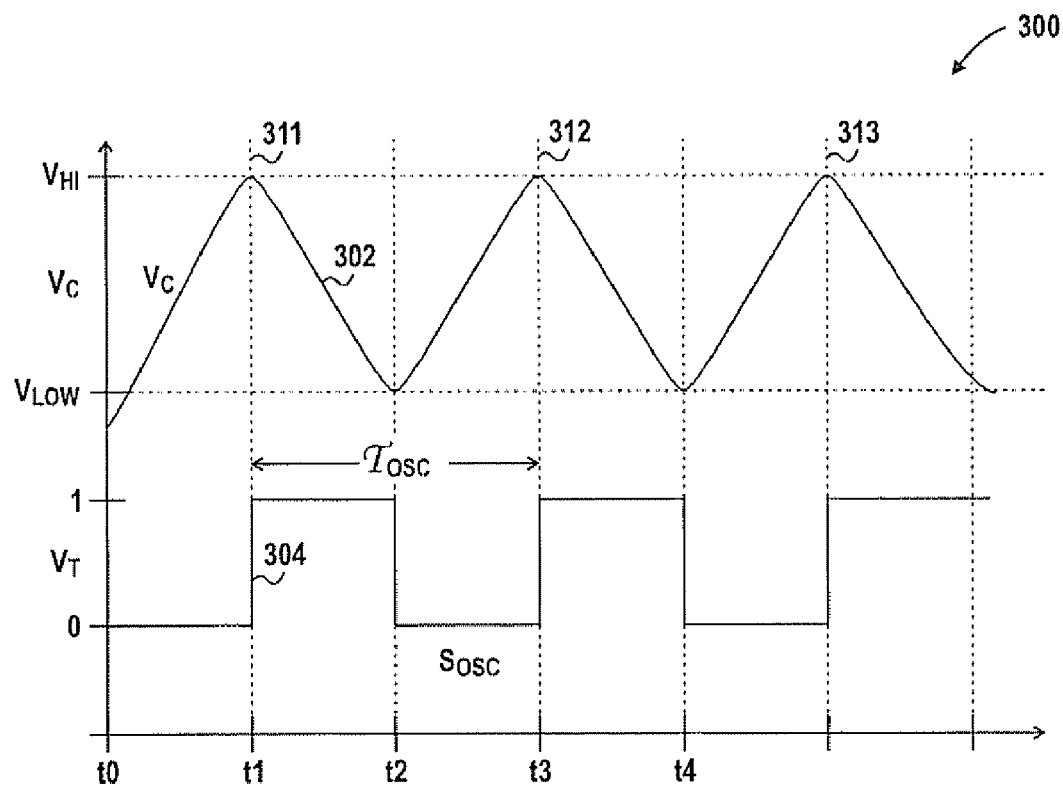
FIG. 3 is a signal chart illustrating an operation of a capacitor-based oscillator of the BIST component of FIG. 2 in accordance with at least one embodiment of the present disclosure.

FIGS. 2 and 3 illustrate an example implementation of the BIST component 108 with the DAC 106 in accordance with at least one embodiment of the present disclosure. The DAC 106 includes the drive code latch 110 and the current driver 112 and the BIST component 108 includes the relaxation oscillator 116, the counter 118, the test verify module 120 and the pattern generator 122 as described above. In the depicted example, the relaxation oscillator 116 includes a capacitor 202 (having a capacitance $C_{osc}$), a comparator 204, a switch 206, and a switch 208. The capacitor 202 includes a first electrode and a second electrode, whereby the second electrode is connected to a ground reference. The switches 206 and 208 can be implemented as one or more transistors, pass gates, relays, and the like. In the embodiment of FIG. 2, the switch 206 includes a p-type transistor having a first current electrode connected to the output of the current driver 112, a second current electrode connected to the first electrode of the capacitor, and a control electrode, and the switch 208 includes an n-type transistor having a first current electrode connected to the first electrode of the capacitor 202, a second current electrode connected to the ground reference, and a control electrode. The switches 206 and 208 are configured such that one only one is conductive ("closed") at any given time.

In an embodiment implementing hysteresis, the comparator 204 includes an input to receive a high reference $V_{HI}$, an input to receive a low reference $V_{LOW}$, an input coupled to the first electrode of the capacitor 202, and an output to provide the oscillation signal $S_{osc}$ having either a high voltage (e.g., logic "1") or a low voltage (e.g., logic "0") based on the voltage $V_C$ of the capacitor 202 relative to the high reference $V_{HI}$ and the low reference $V_{LOW}$. To illustrate, when the voltage $V_C$ is below the low reference $V_{LOW}$ the voltage $V_T$ of the output of the comparator 204 is logic "0", when the voltage $V_C$ is above the high reference $V_{HI}$ the voltage $V_T$ of the output of the comparator 204 is logic "1", and when the voltage $V_C$ is between the low reference $V_{LOW}$ and the high reference $V_{HI}$ the voltage $V_T$ of the output of the comparator 204 remains in its previous state. The output of the comparator 204 is connected to the count input of the counter 118 and to the control gates of the switches 206 and 208. In a non-hysteresis implementation, the comparator 204 need only a single reference voltage.

FIG. 3 is chart 300 illustrating an example operation of the relaxation oscillator 116 of FIG. 2 so as to generate an oscillation signal $S_{osc}$ having an oscillation frequency proportional to the magnitude of the output current $I_{out}$. In chart 300, line 302 represents the magnitude of the voltage $V_C$ of the capacitor 202 and line 304 represents the voltage $V_T$ of the oscillation signal $S_{osc}$ (i.e., the signal at the output of the comparator 204). At the initiation of a test mode (time to), the voltage $V_C$ of the capacitor 202 is approximately zero, which in turn causes the comparator 204 to configure its output voltage to zero, and thereby causing the switch 206 to close (become conductive) and the switch 208 to open (become non-conductive). In this state, the first electrode of the capacitor 202 becomes connected to the output of the current driver 112 via the switch 206. A test value is latched into the drive code latch 110, which controls the current driver 112 to provide the current $I_{out}$ with a magnitude proportional to the test value. The current $I_{out}$ charges the capacitor 202, thereby increasing the voltage $V_C$ at a rate represented in simplified form by EQ. 1:

$$dV_C = \frac{I_{out}}{C_{osc}} dt \qquad \text{EQ. 1}$$

where $dV_C$ represents the rate of change in $V_C$ (e.g., $V_{HI}$−$V_{LOW}$) and manifests itself as the oscillation frequency. Thus, from EQ. 1 it can be seen that the rate of increase in the voltage $V_C$ of the capacitor is proportional to the magnitude of the output current $I_{out}$.

The voltage VC of the capacitor 202 continues to rise due to the output current $I_{out}$. When it reaches the high reference $V_{HI}$ (time t1), the output voltage of the comparator 204 switches to a logic "1", thereby closing the switch 208 and opening the switch 206. With the switch 208 closed and the switch 206 open, the first electrode of the capacitor 202 is disconnected from the output of the current driver 112 and connected instead to the ground reference. As a result, the capacitor 202 begins to discharge, thereby decreasing the magnitude of the voltage $V_C$ of the capacitor 202. When the voltage $V_C$ of the capacitor 202 falls to the low reference $V_{LOW}$ (time t2), the comparator 204 reconfigures its output to a logic "0", which closes the switch 206 and opens the switch 208, thereby reconnecting the first electrode of the capacitor 202 to the output current $I_{out}$ of the current driver 112 and disconnecting the first electrode of the capacitor from the ground reference. Thus, the capacitor 202 begins to charge again, increasing the magnitude of the voltage $V_C$ of the capacitor 202. Thus, when the voltage $V_C$ of the capacitor 202 reaches the high reference $V_{HI}$ again (time t3), the output of the comparator 204 is changed to a logic "1" and the switches 206 and 208 reconnect the first electrode of the capacitor 202 from the output of the current driver 112 to the ground reference, thereby causing the capacitor 202 to discharge until its voltage $V_C$ falls to the low reference $V_{LOW}$ (time t4), at which time the output of the comparator 204 is reconverted to a logic "0". This again causes the switches 206 and 208 to reconnect the first electrode of the capacitor 202 from the ground reference back to the output of the current driver 112, and the charge/discharge cycle repeats.

In one embodiment, the counter 118 utilizes a certain edge or transition (e.g., rising edges 311, 312, and 313) to count the number of oscillations that occur in the oscillation signal $S_{osc}$ (i.e., the output of the comparator 204) over the fixed duration of use of the corresponding test value to control the DAC 106. As illustrated by chart 300, the rate at which the voltage $V_C$ of the capacitor 202 rises to the high reference $V_{HI}$ is proportional to the magnitude of the output current $I_{out}$ and thus the frequency $f_{osc}$ of the oscillation signal $S_{osc}$ is proportional to the magnitude of the output current $I_{out}$. Thus, the total oscillation count for the fixed duration represents the magnitude of the output current $I_{out}$, which in turn should be proportional to the magnitude of the test value when the DAC 106 is operating linearly.

Turning again to FIG. 2, it will be appreciated that it likely will take the relaxation counter 116 some non-zero time to reach a new frequency once the test value is changed. Accordingly, in at least one embodiment, a capacitor 212 or other delay element can be connected to the output of the comparator 204 so as to introduce a delay before starting counting for a new test value so as to compensate for the time needed for the relaxation oscillator 118 to reach the new frequency, thereby reducing the likelihood of introducing glitches. The capacitor 212 further can compensate for kick-back noise in the circuit.

Figure 4:
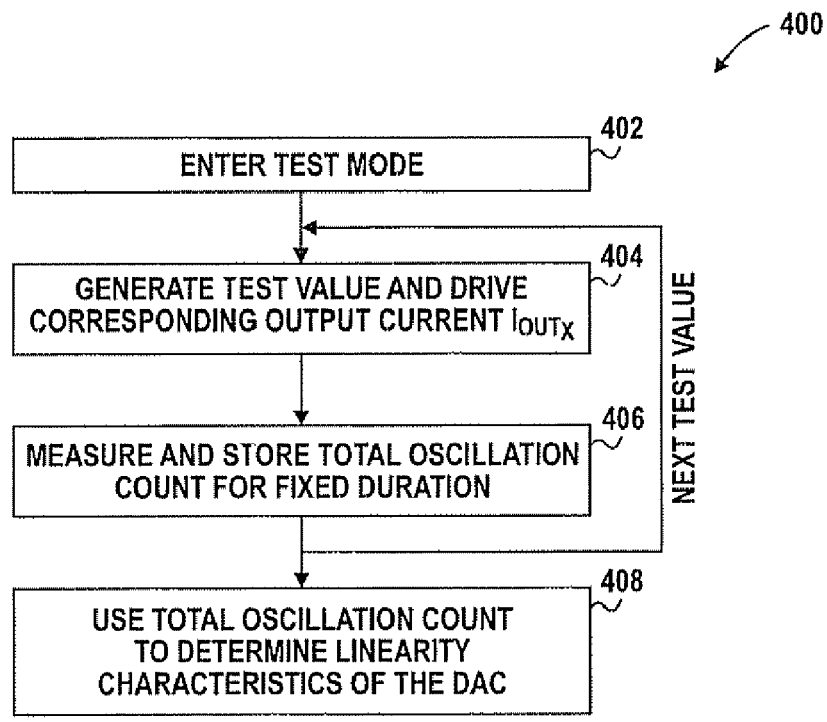
FIG. 4 is a flow diagram illustrating an example test method for a DAC using the BIST component of FIGS. 1 and 2 in accordance with at least one embodiment of the present disclosure.

FIG. 4 illustrates an example method 400 of operation of the DAC 106 and the BIST component 108 of FIGS. 1 and 2 in a test mode in accordance with at least one embodiment of the present disclosure. At block 402, the video source 102 enters a test mode so as to verify correct operation of the DAC 106. Accordingly, the BIST controller 124 (FIG. 1) enables the components of the BIST component 108, including initializing the pattern generator 122 to initiate output of a predetermined series of test values, enabling the counter 118 and clearing the count value of the counter 118, and initializing the relaxation oscillator 116. Further, the multiplexer 114 is configured to provide the test values output by the pattern generator 122 to the drive code latch 110.

At block 404, the pattern generator 122 generates a test value of the series and provides the test value to the drive control latch so as to configure the current driver 112 to drive the output current $I_{out}$ at a magnitude corresponding to the test value for a fixed duration. While driving the output current $I_{out}$ based on the test value, at block 406 the relaxation oscillator 116 generates a signal $S_{osc}$ having a frequency $f_{osc}$ substantially proportional to the magnitude of the output current $I_{out}$. Accordingly, at block 406, the counter 118 counts the number of oscillations of the signal $S_{osc}$ over the fixed duration that the test value is used to drive the DAC 106 and the counter 118 provides this total oscillation count value to the test verify module 120. The BIST controller 124 then clears the counter 118 and the process of blocks 404 and 406 is repeated for the next test value in the series of test values.

At block 408, the test verify module 120 utilizes the total count values determined for some or all of the series of test values to assess the operational characteristics of the DAC 106. In one embodiment, the test verify module 120 stores each total count value and then performs one or more analysis operations at the conclusion of the series of test values. In another embodiment, the test verify module 120 performs an ongoing or running analysis as the total oscillation counts are generated.

To illustrate, the test verify module 120 can analyze the differential non-linearity (DNL) characteristics of the DAC 106 by determining the change in the total oscillation count between the ith test value and the i−1th test value by subtracting the total oscillation count determined for the i−1th test value from the total oscillation count determined for the nth test value for each adjacent pair of test values. In the event that the change in the total oscillation count between each pair of adjacent test values is within a predetermined threshold (e.g., a threshold corresponding to 1 least significant bit (LSB)) or is relatively constant between each pair of adjacent test values, the test verify module 120 may signal that the DAC 106 meets DNL specifications represented by the predetermined threshold. Otherwise, the test verify module 120 can signal that the DAC 106 fails the DNL specifications.

This DNL analysis can be represented by the example algorithm of Table 1. For this algorithm, it is assumed that the test values increase monotonically, i.e., test value(i−1)<test value(i)<test value(i+1), Thus for each pair of test values that are adjacent in the series, the latter test value is greater than the earlier test value (in the case of a positive ramp, and vice versa for a negative ramp).

TABLE 1

DNL Analysis:

```
clear flag     // the flag is used to identify whether the DNL specifications
               // have been exceeded
for i = 2 to n {      // n = number of test values in series
    Δ = total_oscillation_count (i) − total_oscillation_count (i−1)
    if Δ > threshold then set flag    // threshold is based on DNL
                                       specifications
                                       // e.g., equivalent of 1 LSB
}     // repeat for each adjacent pair of test values in series
if flag is set, then signal that the DAC 106 fails the DNL analysis
else if flag is not set, then signal that the DAC 106 meets the DNL spec-
ifications
```

Although Table 1 illustrates a process whereby the analysis is completed after the total oscillation counts are determined for all of the test values in the series, in another embodiment the comparison of the change in the total oscillation count from one test value to the next (the variable A in Table 1) can be determined and compared with the predetermined threshold as each total oscillation count is generated.

Similarly, the expected total oscillation value for each test value can be predicted, modeled, or estimated and a lookup table having the expected total oscillation values indexed by test value can be implemented at the test verify module. Thus, to determine the integral non-linearity (INL) characteristics of the DAC 106, after a test value is supplied to the DAC 106 and the corresponding total oscillation count value for the test is determined, the test verify module 120 can use the test value to index the lookup table to identify the expected total oscillation count value and compare the actual oscillation count value with the expected total oscillation count value. If the difference is within a predetermined threshold (corresponding to, for example, 1 LSB), the test verify module 120 can signal that the DAC 106 meets INL specifications. Otherwise, if the difference exceeds the threshold, the test verify module 120 can signal that the DAC 106 fails to meet the INL specifications.

Alternately, for INL analysis, the test verify module 120 can sum the total oscillation counts determined and divide the result by the number of test values utilized thus far. The resulting quotient in effect is an average total oscillation count, which can be compared with a predetermined expected quotient corresponding to the number of test values thus far to determine if the DAC 106 is operating within the INL specifications. This INL analysis can be represented by the algorithm of Table 2.

TABLE 2

INL Analysis:

```
clear flag       // the flag is used to identify whether the INL specifications
                 // have been exceeded
sum = 0          // initialize sum to 0
count = 0        // initialize count to 0
while not end of series {
    receive total_oscillation_count   // receive total oscillation count from counter
                                      // for test value being processed
    count = count + 1        // increment count
    sum = sum + total_oscillation_count
    actual_avg = sum / count    // determine average total oscillation count for
                                // number of test values processed thus far
    expected_avg = lookup_table(count)  // access the expected average total
                                        // oscillation count for the number of test
                                        // values processed thus far from a lookup
                                        // table indexed by the number of test values
                                        // processed thus far
    Δ = | actual_avg − expected_avg |   // determine the difference between the actual
                                        // average and the ideal average total oscillation
                                        // count for the number of test values
                                        // processed thus far
    if Δ > threshold then set flag   // threshold is based on INL specifications
                                     // e.g., equivalent of 1 LSB
    if flag is set, then signal that the DAC 106 fails the INL analysis
}       // repeat for each determined total oscillation count until series is complete
if flag is not set, then signal that the DAC 106 meets the INL specifications
```

Although certain example methods for determining operational characteristics of the DAC 106 based on the oscillation signal $S_{osc}$ of the relaxation oscillator 116 are described, those skilled in the art can implement alternate operational analysis techniques based on the oscillation signal $S_{osc}$ using the guidelines provided herein.

Figure 5:
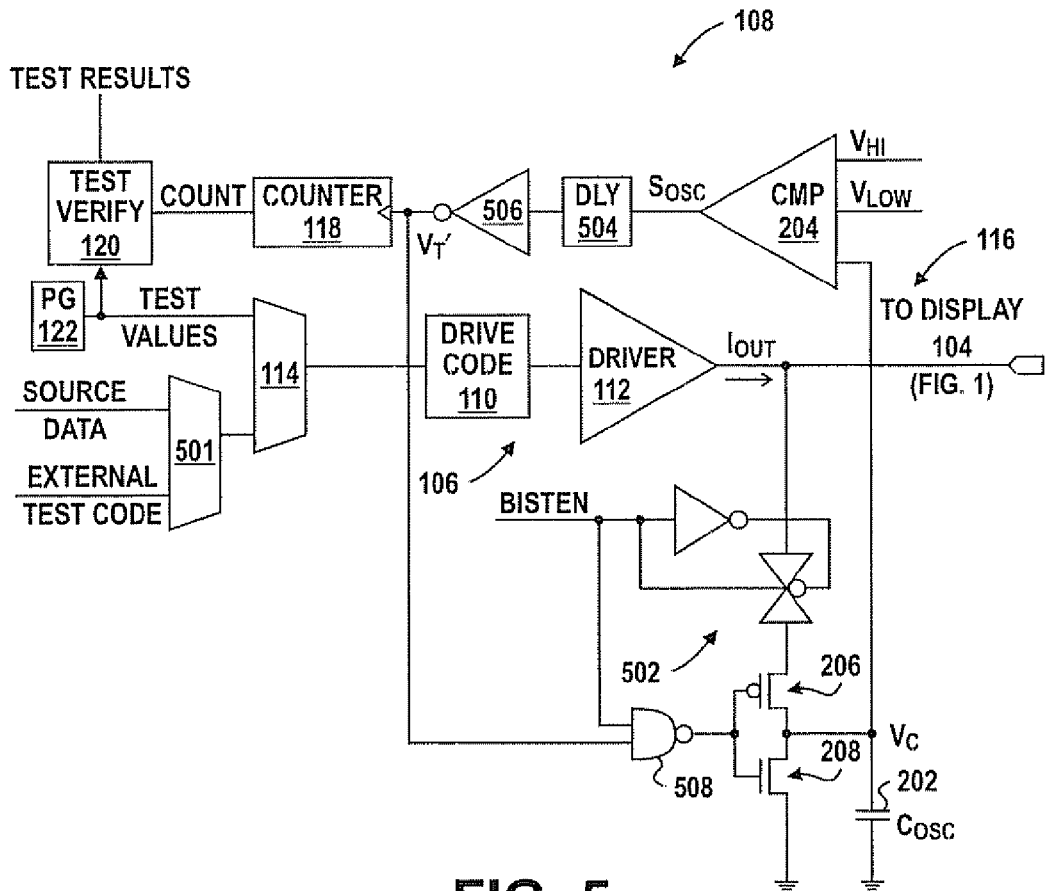
FIG. 5 is a diagram illustrating another example implementation of the DAC and the BIST component of FIG. 1 in accordance with at least one embodiment of the present disclosure.

FIG. 5 illustrates a more detailed example implementation of the BIST component 108 with the DAC 106 in accordance with at least one embodiment of the present disclosure. The DAC 106 includes the multiplexer 114, the drive code latch 110, and the current driver 112 as described above. The DAC 106 further can include a second multiplexer 501 capable of selecting between source video data and other functional test code input via, e.g., a scan chain. The BIST component 108 includes the counter 118, the test verify module 120, the pattern generator 122 and the relaxation oscillator 116.

As described above with reference to FIG. 2, the relaxation oscillator 116 includes the capacitor 202, the comparator 204, and the switches 206 and 208. In the example of FIG. 5, the relaxation oscillator 116 further includes a high-impedance pass gate 502 disposed between the switch 206 and the output of the current driver 112 so as to reduce or eliminate current leakage by the switches 206 and 208 and the capacitor 202 when the DAC 106 is in an operational mode rather than the test mode.

Further, in the depicted example, a programmable delay element 504 is disposed between the output of the comparator 204 and the counter 118 so as to introduce a programmable delay between the output of the comparator 204 and the input of the counter 118. The programmable delay element 504 can include, for example, one or more buffers that can be selectively connected in series to implement a desired delay. Thus, the programmable delay element 504 increases the period of oscillation of the relaxation oscillator 116 (i.e., decrease the frequency $f_{osc}$) so as to meet minimum timing requirements (e.g., setup and hold times) of the counter 118 without affecting the sensitivity of the BIST component 108 because, as discussed above, relative comparisons of the total oscillation counts can be used to determine the linearity characteristics of the DAC 106. Also, in the example of FIG. 5, an inverter 506 and a NAND gate 508 can be utilized to control the switches 206 and 208 based on both the state of the comparator 204 and the state of a BISTEN signal, whereby the BISTEN signal is asserted when the video source 102 (FIG. 1) is in the test mode. As also illustrated, the BISTEN signal also controls the high-impedance pass gate 502 so as to be transmissive when the BISTEN signal is asserted and non-transmissive when the BISTEN signal is not asserted.

Figure 6:
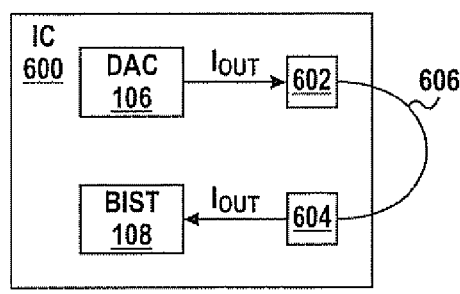
FIG. 6 is a diagram illustrating an external loopback connection between a DAC and a BIST component in accordance with at least one embodiment of the present disclosure.

FIG. 6 illustrates an example use of an external loopback to reduce current leakage of the BIST component 108 of FIG. 1 in accordance with at least one embodiment of the present disclosure. In the depicted example, some or all of the components of the DAC 106 and some or all of the components of the BIST component 108 are implemented on the same integrated circuit (IC) 600, system-on-a-chip (SOC), or other packaged circuit device. However, because the BIST component 108 is connected to the output of the DAC 106, the BIST component 108 has the potential to unnecessarily sink current when it is inoperative (i.e., during normal operation of the DAC 106). Accordingly, rather than connect the input of the BIST component 108 to the output of the DAC 106 using a conductive structure internal to the IC 600, in the illustrated embodiment the output of the DAC 106 is connected to a first external interface pin 602 and the input of the BIST component 108 is connected to a second external interface pin 604 such that the DAC 106 and the BIST component 108 are not connected internal to the IC 600. Rather, the external interface pins 602 and 604 can be connected via a loopback wire 606 during testing of the DAC 106. If the DAC 106 is to be tested only after manufacture, the loopback wire 606 can be removed or severed after testing is complete so as to isolate the BIST component 108 from the DAC 106, thereby reducing or eliminating current leakage by the BIST component 108 during normal operation.

Figure 7:
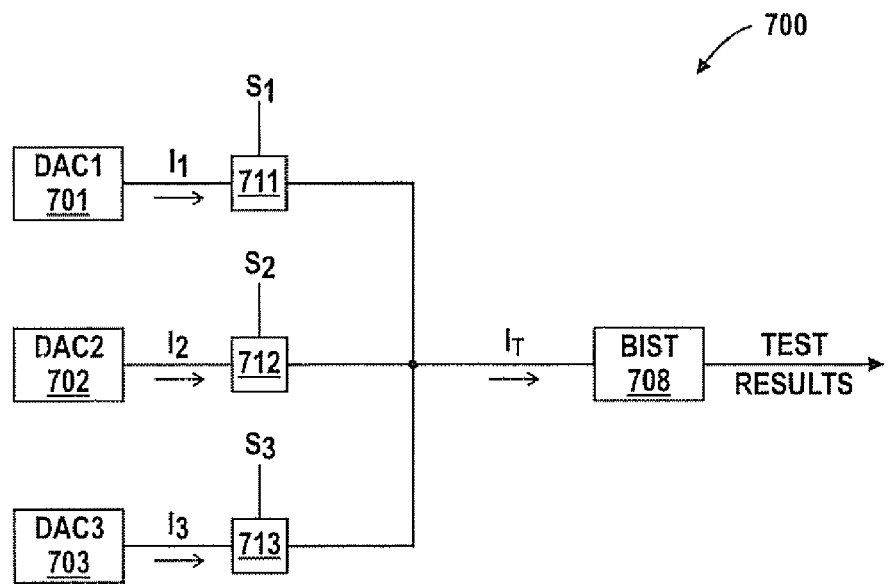
FIG. 7 is a diagram illustrating a multiple-DAC system utilizing a BIST component in accordance with at least one embodiment of the present disclosure.
Figure 8:
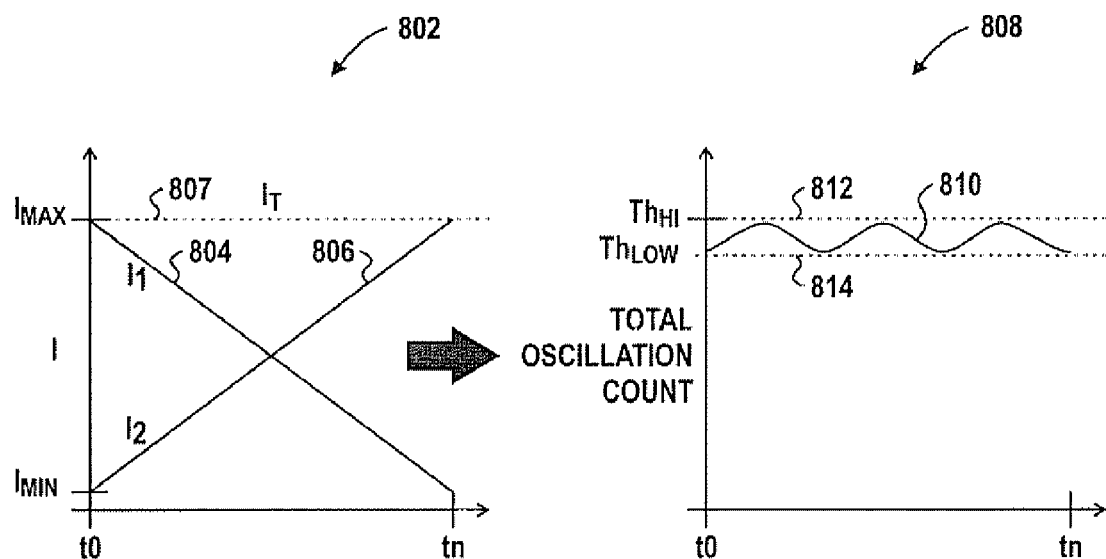
FIG. 8 is a chart illustrating an example test operation of the multiple-DAC system in accordance with at least one embodiment of the present disclosure.

FIGS. 7 and 8 illustrate an exemplary technique for determining operational characteristics of multiple current-steering DACs in accordance with at least one embodiment of the present disclosure. FIG. 8 illustrates a multiple-DAC system 700 comprising a plurality of current-steering DACs, including three DACs 701, 702, and 703, and a BIST component 708 (corresponding to the BIST component 108) selectively connectable to the outputs of the DACs 701-703 via switches 711-713 (e.g., relays), respectively. In a video context, the three DACS 701-703 can be used to separately drive the red, green, and blue channels in a RGB video system, to separately drive the three video data channels in a high-definition multimedia interface (HDMI) video system, etc.

In the depicted example, the BIST component 708 receives an input current $I_T$ that is the sum of one or more of the output currents of the DACS 701-703 (currents $I_1$, $I_2$, and $I_3$, respectively). The BIST component 708 can control the switches 711-713 to control which output currents contribute to the input current $I_T$, which the BIST component 708 tests in the manner described above.

Although relaxation oscillators generally operate in a substantially linear manner, the relatively large range of currents being sourced by the DAC and the speed at which the test is conducted has the potential to introduce a non-linearity into the operation of the relaxation oscillator implemented by the BIST component 708, which in turn can lead to errors in evaluating the linear characteristics of DACs tested by the BIST component 708. Accordingly, in at least one embodiment, some or all of the possible pairings of the DACS 701-703 are tested simultaneously so that any non-linear characteristics of the BIST component 708 can be effectively nullified. By using this approach, the non-linearity of the BIST component 708 as the test values are stepped across the full range is reduced or eliminated and the relaxation oscillator can operate at one frequency and can be tuned to be very sensitive around that frequency/current and because there is no settling time for the relation oscillator to reach its new frequency as it is operating continuously at the same frequency +/–one LSB equivalent count.

For this test process, each DAC pair of the DACS 701-703 is tested by configuring one of the DACs to step up through a monotonically increasing series of test values while simultaneously configuring the other DAC of the pair to step down through the series of test values. Thus, the current output by the first DAC should increase from a magnitude $I_{min}$ (e.g., 0) to a magnitude $I_{max}$, while the current output by the second DAC decreases from the magnitude $I_{max}$ to the magnitude $I_{min}$. If both DACs are operating according to operating specifications, then the magnitude of the sum of the currents output by the pair of DACs (i.e., current $I_T$) should be relatively fixed at $I_{max}+I_{min}$ (or at $I_{max}$ when $I_{min}=0$). Thus, the BIST comparator 108 can monitor the current $I_T$ output by each DAC pair so configured to verify whether the current $I_T$ is maintained within a certain threshold of $I_{max}+I_{min}$ throughout the entire series of test values.

To illustrate, FIG. 8 depicts a chart 802 representing the output current $I_1$ (line 804) and the output current $I_2$ as the DAC 701 steps down through a series of test values ($TV_N$ to $Tv_1$) and the DAC 702 steps up through the series ($TV_1$ to $TV_N$), where the output of the DACs 701 or 702 is $I_{max}$ for the test value $TV_N$ and $T_{min}$ for the test value $TV_1$. As illustrated by chart 802, the current $I_T$ (line 807) represents the sum of the currents $I_1$ and $I_2$ (assuming $I_{min}=0$), which should be relatively constant if both DAC 701 and 702 are operating as intended.

FIG. 8 also illustrates a chart 808 representing the total oscillation count (line 810) determined by the BIST component 708 from the sum of the currents $I_1$ and $I_2$ (as current $I_T$) for each step through the series of test values. Assuming the BIST component 708 and the DACS 701 and 702 are operating as intended, the total oscillation count across the series should be relatively constant and the total oscillation count for each step should fall between an upper threshold (line 812) and a lower threshold (line 814). In the event that the corresponding test results reveal that a total oscillation count for a step exceeds one of the thresholds, it can be determined that one or more of the BIST component 708, the DAC 701, and 702 is not operating as intended. Accordingly, this test can be performed for the pair DAC 701-DAC 702, the pair DAC 702-DAC 703, and the pair DAC 701-DAC 703 so as to more specifically identify which component is operating outside of operational specifications.

In this document, relational terms such as "first" and "second", and the like, may be used solely to distinguish one entity or action from another entity or action without necessarily requiring or implying any actual such relationship or order between such entities or actions. The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

The terms "assert" or "set" and "negate" (or "deassert" or "clear") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Other embodiments, uses, and advantages of the disclosure will be apparent to those skilled in the art from consideration of the specification and practice of the disclosure disclosed herein. The specification and drawings should be considered as examples only, and the scope of the disclosure is accordingly intended to be limited only by the following claims and equivalents thereof.

What is claimed is:

1. A method comprising:
providing a current-steering digital-to-analog converter (DAC) configured to provide an adjustable output current and a relaxation oscillator configured to output a signal having an oscillation frequency based on a magnitude of the output current; and
determining an operational characteristic of the current-steering DAC based on the oscillation frequency of the signal.

2. The method of claim 1, wherein determining the operational characteristic of the current-steering DAC comprises:
configuring the current-steering DAC to output a first current as the output current based on a first test value for a first duration;
determining a first oscillation count of oscillations of the signal over the first duration;
configuring the current-steering DAC to output a second current as the output current based on a second test value for a second duration;
determining a second oscillation count of oscillations of the signal over the second duration; and
determining a differential non-linearity (DNL) characteristic of the current-steering DAC based on a difference between the first oscillation count and the second oscillation count.

3. The method of claim 2, wherein determining the DNL characteristic of the current-steering DAC comprises identifying the current-steering DAC as exceeding a DNL specification in response to determining the difference exceeds a predetermined threshold.

4. The method of claim 2, wherein the first duration and the second duration are substantially equal.

5. The method of claim 1, wherein determining the operational characteristic of the current-steering DAC comprises:
configuring the current-steering DAC to output a select current as the output current based on a test value for a predetermined duration;
determining a first oscillation count of oscillations of the signal over the predetermined duration;
determining a second oscillation count based on the test value, the second oscillation count comprising a predetermined expected oscillation count for the test value; and
determining a differential non-linearity (DNL) characteristic of the current-steering DAC based on a difference between the first oscillation count and the second oscillation count.

6. The method of claim 5, wherein determining the DNL characteristic of the current-steering DAC comprises identifying the current-steering DAC as exceeding an DNL specification in response to determining the difference between the first oscillation count and the second oscillation count exceeds a predetermined threshold.

7. The method of claim 1, wherein determining the operational characteristic of the current-steering DAC comprises:
for each test value of a plurality of test values, configuring the current-steering DAC to provide as the output current a current based on the test value for a predetermined duration;
for each test value of the plurality of test values, determining an oscillation count of oscillations of the signal over the predetermined duration;
determining a sum of the oscillation counts for the plurality of test values;
determining a first quotient of the sum to a number of test values of the plurality of test values;
determining a second quotient based on the number of test values of the plurality of test values, the second quotient comprising a predetermined quotient associated with the number of test values of the plurality of test values; and
determining an integral non-linearity (INL) characteristic of the current-steering DAC based on a difference between the first quotient and the second quotient.

8. A system comprising:
a current-steering digital-to-analog converter (DAC) comprising an input to receive a drive code value and an output to provide an output current having a magnitude based on the drive code value; and
a test component comprising:
a relaxation oscillator comprising an input coupled to the output of the current-steering DAC, the relaxation oscillator configured to output a signal having an oscillation frequency based on a magnitude of the output current; and
a test verify module configured to determine an operational characteristic of the current-steering DAC based on the oscillation frequency of the signal.

9. The system of claim 8, wherein the test component comprises:
a counter comprising an input to receive the signal, the counter configured to determine an oscillation count of the signal over a fixed duration; and
wherein the test verify module is configured to determine the operational characteristic based on the oscillation count.

10. The system of claim 8, wherein the relaxation oscillator comprises:
a capacitor comprising a first electrode and a second electrode;
a first switch comprising a first current electrode coupled to the current-steering DAC, a second current electrode coupled to the first electrode of the capacitor, and a control electrode;
a second switch comprising a first current electrode coupled to the first electrode of the capacitor, a second electrode coupled to a ground reference, and a control electrode; and
a comparator comprising an input coupled to the first electrode of the capacitor and one or more inputs to receive one or more reference voltages, and an output to provide the signal, the output coupled to the control electrode of the first switch and the control electrode of the second switch and the comparator configured to adjust the signal between a first value and a second value based on a voltage of the first electrode of the capacitor in comparison to the one or more reference voltages.

11. The system of claim 10, further comprising:
a counter comprising an input to receive the signal, the counter configured to determine an oscillation count of the signal over a fixed duration;
a programmable delay element coupled between the output of the comparator and the input of the counter; and
wherein the test verify module is configured to determine the operational characteristic based on the oscillation count.

12. The system of claim 8, wherein the test component comprises:
a pattern generator configured to provide each of a plurality of test values in sequence to the current-steering DAC as the drive code value for a fixed duration;
a counter comprising an input to receive the signal, the counter configured to, for each test value of the plurality of test values, determine an oscillation count of the signal over the fixed duration that the corresponding test value is provided to the current-steering DAC; and
the test verify module is configured to determine the operational characteristic of the current-steering DAC based on at least a subset of oscillation counts corresponding to the plurality of test values.

13. The system of claim 12, wherein the test verify module is configured to determine the operational characteristic by determining a differential non-linearity (DNL) characteristic of the current-steering DAC based on difference between a first oscillation count and a second oscillation count, the first oscillation count corresponding to a first test value of the plurality of test values and the second oscillation count corresponding to a second test value of the plurality of test values.

14. The system of claim 13, wherein the test verify module is configured to determine the current-steering DAC exceeds a DNL specification in response to the difference exceeding a predetermined threshold.

15. The system of claim 12, wherein the test verify module is configured to determine the operational characteristic by determining an integral non-linearity (INL) characteristic of the current-steering DAC based on a difference between a first oscillation count and a second oscillation count, the first oscillation count determined for a select test value of the plurality of test values based on the counter and the second oscillation count comprising a predetermined expected oscillation count for the select test value.

16. The system of claim 12, wherein the test verify module is configured to determine the operational characteristic by determining an integral non-linearity (INL) characteristic of the current-steering DAC based on a quotient of a sum of at least the subset of the oscillation counts to a number of oscillation counts of at least the subset of the oscillation counts.

17. The system of claim 8, further comprising an integrated circuit (IC) device, the IC device comprising the current-steering DAC and the test component.

18. The system of claim 17, further comprising:
a loopback wire coupled to a first external interface pin and a second external interface pin, the first external interface pin internally coupled to the output of the current-steering DAC and internally decoupled from the test component, and the second external interface pin internally coupled to the input of the relaxation oscillator and internally decoupled from the current-steering DAC.

19. A method comprising:
providing a first current-steering digital-to-analog converter (DAC) configured to provide an adjustable first output current based on an input test value;
providing a second current-steering DAC configured to provide an adjustable second output current based on an input test value;
providing a relaxation oscillator configured to output a signal having an oscillation frequency based on a magnitude of a sum of the first output current and the second output current;
configuring the first current-steering DAC to step through a series of monotonically increasing test values starting at a first test value of the series and ending at a last value of the series and the second current-steering DAC to concurrently step through the series starting at the last test value and ending at the first value, each step of the series having a fixed duration;
determining an oscillation count of the signal for each step of the series to generate a plurality of oscillation counts; and
determining an operational characteristic based on the plurality of oscillation counts.

20. The method of claim 19, wherein determining the operational characteristic comprises identifying at least one of the first current-steering DAC or the second current-steering DAC as exceeding an operational specification in response to determining at least one oscillation counts of the plurality of oscillation counts exceeds a predetermined threshold.

* * * * *